(12) United States Patent
Irino

(10) Patent No.: US 7,750,730 B2
(45) Date of Patent: Jul. 6, 2010

(54) BANDPASS FILTER CIRCUIT

(75) Inventor: Hitoshi Irino, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 208 days.

(21) Appl. No.: 11/976,348

(22) Filed: Oct. 24, 2007

(65) Prior Publication Data
US 2008/0094134 A1 Apr. 24, 2008

(30) Foreign Application Priority Data
Oct. 24, 2006 (JP) ............................. 2006-288694

(51) Int. Cl.
*H03K 5/00* (2006.01)
(52) U.S. Cl. ...................... 327/557; 327/551
(58) Field of Classification Search ................. 327/551, 327/553, 557
See application file for complete search history.

(56) References Cited

U.S. PATENT DOCUMENTS

| | | | | |
|---|---|---|---|---|
| 5,428,835 A * | 6/1995 | Okanobu | ..................... | 455/310 |
| 7,081,788 B2 * | 7/2006 | Hagari | ......................... | 327/553 |
| 7,283,214 B2 * | 10/2007 | Xu et al. | .................... | 356/5.15 |
| 7,460,449 B2 * | 12/2008 | Yu et al. | ..................... | 369/47.1 |
| 7,529,331 B2 * | 5/2009 | Hsiao | ......................... | 375/376 |

FOREIGN PATENT DOCUMENTS

JP 2002-57578 2/2002

* cited by examiner

*Primary Examiner*—Hai L Nguyen
(74) *Attorney, Agent, or Firm*—McGinn IP Law Group, PLLC

(57) ABSTRACT

A semiconductor integrated circuit device provided with an input terminal supplied with a reference frequency signal from outside of the device, a bandpass filter circuit coupled to the input terminal and outputting an internal reference frequency signal and a PLL circuit coupled to the bandpass filter circuit to receive the internal reference frequency signal. The input terminal is supplied with the reference frequency signal generated by a quartz oscillator or the like mounted on the exterior of the semiconductor integrated circuit device. In response to the signal supplied to the input terminal, the bandpass filter circuit restricts components in a bandwidth except for the frequency of the reference frequency signal, and thus supplies the reference signal to the PLL circuit. The PLL circuit operates by using the reference frequency signal as the reference signal.

2 Claims, 3 Drawing Sheets

BANDPASS FILTER CIRCUIT

BACKGROUND OF THE INVENTION

1. Field of the Invention

The present invention relates to a semiconductor integrated circuit device, particularly to a semiconductor integrated circuit device including a phased locked loop (PLL) circuit for receiving a reference clock signal from the outside.

2. Description of the Related Art

PLL circuits are used for the purpose of multiplication, phase lock, clock extraction and the like. PLL circuits are widely used in various types of electronic equipment for the purpose of, for example, generating a high-frequency clock signal from a low-frequency reference clock signal. PLL circuits have a feed back control function for controlling a voltage controlling oscillator. The control is performed depending on a comparison result that is obtained by receiving and amplifying a signal outputted from a quartz oscillator or the like, thus comparing a reference signal obtained by dividing the resultant signal by use of a reference frequency divider with a signal obtained by dividing the frequency of an oscillation signal from a voltage controlling oscillator (see Japanese Patent Application Laid-open Publication No. 2002-57578, for example). Such PLL circuits make it possible to output a clock signal with a stable frequency for multiplication, phase lock, and clock extraction by using a signal outputted from a quartz oscillator with a stable oscillation frequency as a reference signal.

Generally speaking, in a case where a PLL circuit is included in a semiconductor integrated circuit device, a quartz oscillator or the like for generating a reference frequency signal is mounted, as an exterior attached device, on the exterior of the semiconductor integrated circuit device. In this case, some arrangement position of interconnections between the semiconductor integrated circuit device and the quartz oscillator is likely to allow the interconnections to be influenced by the neighboring interconnections, thereby allowing noise to be superimposed on a signal outputted from the quartz oscillator and to thus go into the semiconductor integrated circuit device. In a case where the PLL circuit receives a signal on which the noise is superimposed, the PLL circuit outputs a clock signal including a lot of jitters.

SUMMARY

The present invention seeks to solve one or more of the above problems, or to improve upon those problems at least in part.

In one embodiment, a semiconductor integrated circuit device includes an input terminal supplied with a reference frequency signals from outside of the device, a bandpass filter circuit coupled to the input terminal and outputting an internal reference frequency signal and a PLL circuit coupled to the bandpass filter circuit to receive the internal reference frequency signal.

According to the present invention, the reference frequency signal is inputted into the PLL circuit through the bandpass filter circuit. Hence, jitter components in a clock signal outputted by the PLL circuit can be reduced.

BRIEF DESCRIPTION OF THE DRAWINGS

The above and other objects, advantages and features of the present invention will be more apparent from the following of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1:
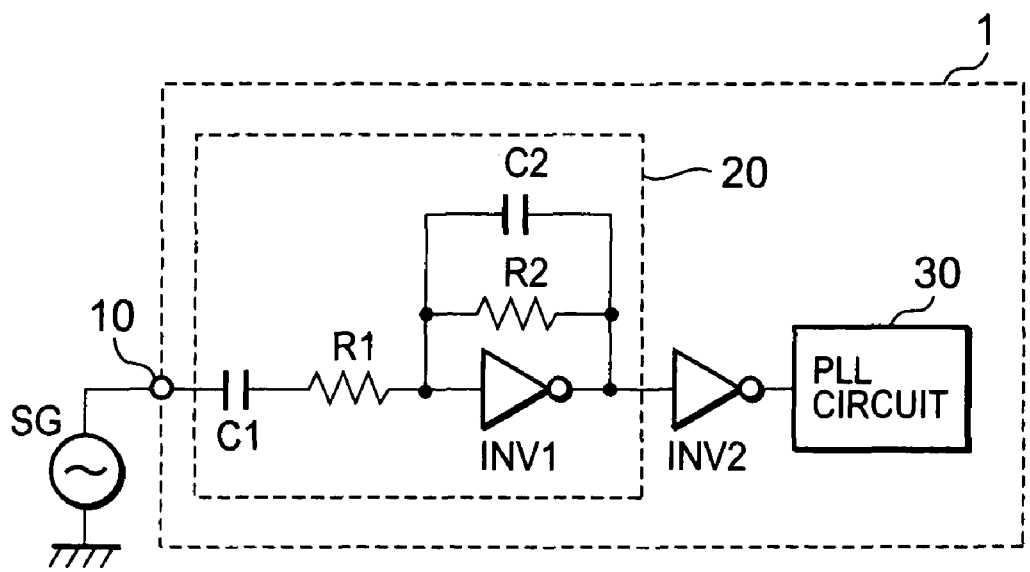
FIG. 1 is a circuit diagram of a semiconductor integrated circuit device according to an embodiment of the present invention.

FIG. 1 is a circuit diagram of a semiconductor integrated circuit device according to an embodiment of the present invention. In FIG. 1, a semiconductor integrated circuit device 1 includes: an input terminal 10 through which a reference frequency signal SG is received; a bandpass filter circuit 20 connected to the input terminal 10 for causing the reference frequency signal SG to pass through; and a PLL circuit 30 for receiving, through a CMOS inverter circuit INV2, a signal which has been outputted from the bandpass filter circuit 20 as a reference signal. The input terminal 10 is supplied with the reference frequency signal SG generated by a quartz oscillator or the like which is mounted on the exterior of the semiconductor integrated circuit device 1. In response to the signal supplied to the input terminal 10, the bandpass filter circuit 20 restricts components in a bandwidth except for the frequency of the reference frequency signal SG, and thus supplies the reference signal to the PLL circuit 30. The PLL circuit 30 operates by using the reference frequency signal SG as the reference signal.

Figure 2:
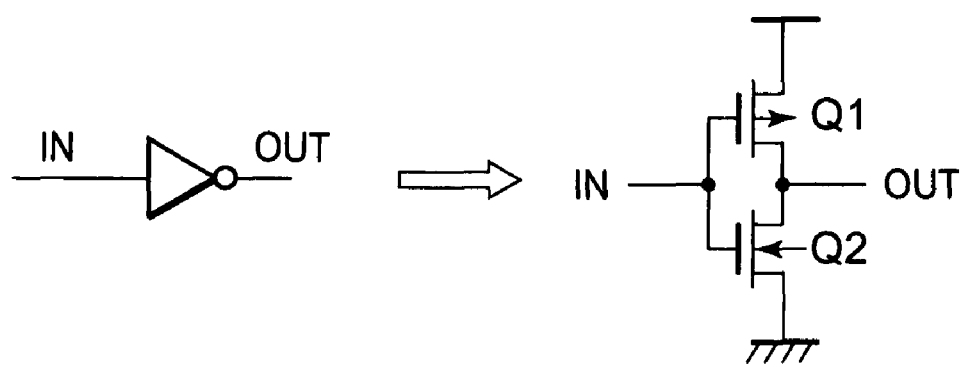
FIG. 2 is a circuit diagram of a CMOS inverter circuit.

The bandpass filter circuit 20 includes a CMOS inverter circuit INV1, resistance elements R1 and R2 as well as capacitance elements C1 and C2. The resistance element R1 and the capacitance element C1 are serially connected to each other. One end of this serially-connected circuit is connected to the input terminal 10 while the other end thereof is connected to the input terminal of the CMOS inverter circuit INV1. In addition, the resistance element R2 and the capacitance element C2 are connected to each other in parallel. One end of each of the resistance element R2 and the capacitance element C2 is connected to the input terminal of the CMOS inverter circuit INV1 while the other end of each of the resistance element R2 and the capacitance element C2 is connected to the output terminal of the CMOS inverter circuit INV1. Here, the CMOS inverter circuit INV1 is a circuit serving as a basic component in the semiconductor integrated circuit device. As shown FIG. 2, the CMOS inverter circuit INV1 functions as an inverting amplifier configured of a p-channel metal-oxide-semiconductor field-effect transistor (PMOSFET) Q1 to an n-channel metal-oxide-semiconductor field-effect transistor (NMOSFET) Q2 connected to each other in parallel. It should be noted that the CMOS inverter circuit INV1 is not particularly limited to the circuit illustrated in FIG. 2 as long as the CMOS inverter circuit INV1 functions as an inverting amplifier. In addition, the capacitor element C1 may be arranged, as an externally-attached element, on the exterior of the semiconductor integrated circuit device 1 depending on the necessity.

Figure 3:
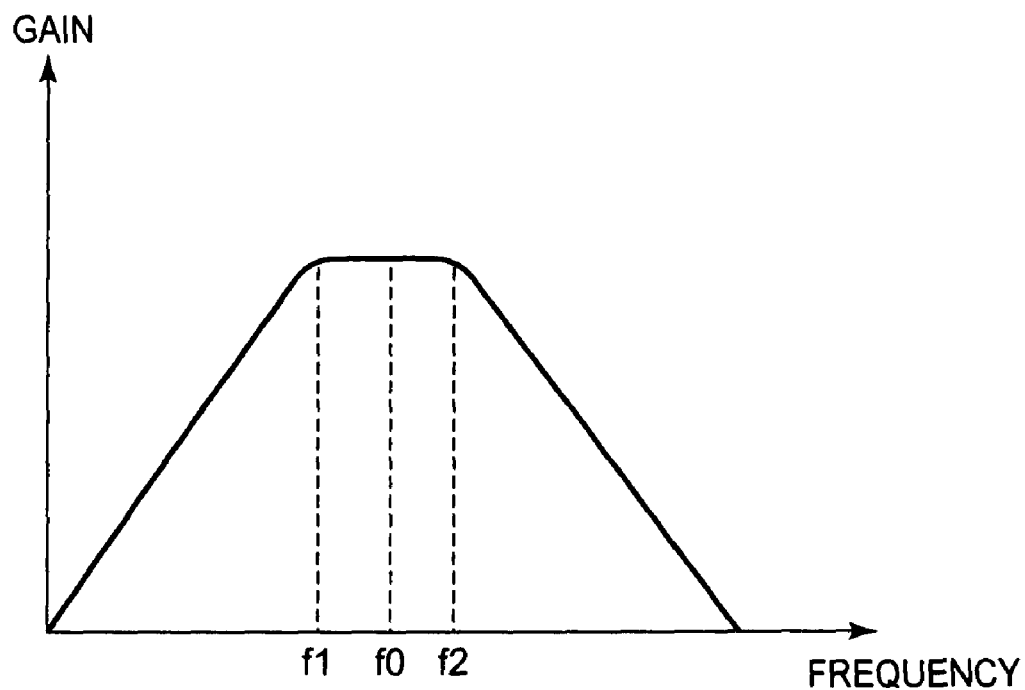
FIG. 3 is a diagram showing a frequency characteristic of a bandpass filter circuit according to the embodiment of the present invention.

The bandpass filter circuit 20 with such a configuration exhibits a frequency characteristic as shown in FIG. 3, where $f1=1/(2\pi \cdot C1 \cdot R1)$, $f2=1/(2\pi \cdot C2 \cdot R2)$, and a range of f1 to f2 denotes the pass band. In a case where $f1<f0<f2$ when the frequency of the reference frequency signal SG is expressed by f0, the band pass filter circuit 20 causes the reference frequency signal SG to pass through, and attenuates noise signal components in the range of frequencies lower than the frequency f1 and noise in the range of frequencies higher than the frequency f2.

Figure 4:
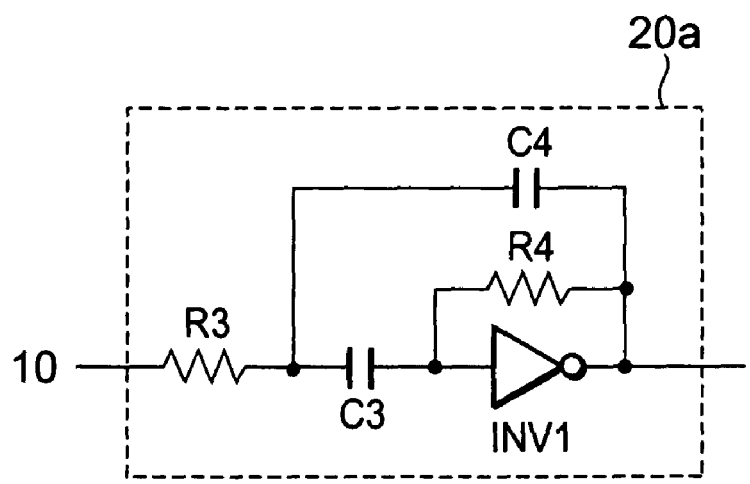
FIG. 4 is a circuit diagram of another bandpass filter circuit according to the embodiment of the present invention.

It should be noted that the bandpass filter circuit 20 is not limited to a bandpass filter circuit with the configuration shown in FIG. 1. For example, a well-known multiple feedback bandpass filter circuit 20a as shown in FIG. 4 may be adopted as the band pass filter circuit included in the semiconductor integrated circuit device 1. In FIG. 4, the bandpass filter circuit 20a includes the CMOS inverter circuit INV1, resistance elements R3 and R4 as well as capacitance elements C3 and C4. One end of the resistance element R3 is connected to the input terminal 10 whereas the other end of the resistance element R3 is connected to one end of each of the capacitance elements C3 and C4. The other end of the capacitance element C3 is connected to the input terminal of the CMOS inverter circuit INV1. The other end of the capacitance element C4 is connected to the output terminal of the CMOS inverter circuit INV1. One end of the resistance element R4 is connected to the input terminal of the CMOS inverter circuit INV1 whereas the other end of the resistance element R4 is connected to the output terminal of the CMOS inverter circuit INV1.

The bandpass filter circuits 20 and 20a which have been described above have very simple circuit configurations, because their amplifiers are each configured of the CMOS inverter circuit INV1. The bandpass filter circuits 20 and 20a are capable of attenuating noise components, particularly noise components of frequencies higher than the frequency of the reference frequency signal SG, which are inputted into the input terminal 10 along with the reference frequency signal SG while causing their respective band passes to include the frequency of the reference frequency signal SG. Thereby, noise components included in the reference signal to be inputted into the PLL circuit 30 can be reduced. As a result, jitter components included in the clock signal outputted by the PLL circuit 30 are reduced to a large extent, and the PLL circuit 30 accordingly operates in a stable manner.

FIRST EXAMPLE

Figure 5:
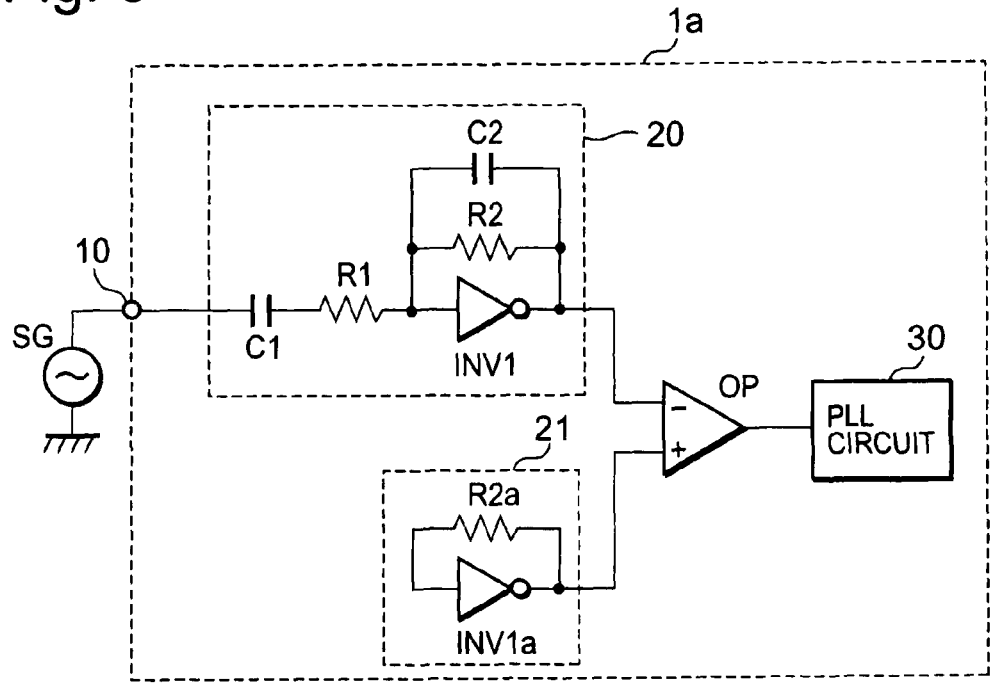
FIG. 5 is a circuit diagram of a semiconductor integrated circuit device according to a first example of the present invention.

FIG. 5 is a circuit diagram of a semiconductor integrated circuit device according to a first example of the present invention. Reference numerals and symbols in FIG. 5 which are the same as those in FIG. 1 denote the same components, and the descriptions for those components will be omitted. The semiconductor integrated circuit device 1a shown in FIG. 5 further includes a differential compensation circuit 21 and an operation amplifier OP in addition to the configuration of the semiconductor integrated circuit device 1 shown in FIG. 1. The differential compensation circuit 21 is configured of a CMOS inverter circuit INV1a whose input and output terminals are connected to each other with a resistance element R2a. The output terminal of the bandpass filter circuit 20 is connected to the inverting input terminal of the operational amplifier OP whereas the output terminal of the differential compensation circuit 21 is connected to the noninverting input terminal of the operational amplifier OP. The output terminal of the operational amplifier OP is connected to the input terminal of the PLL circuit 30.

In this respect, the resistance element R2a is a resistance element with a resistance value equal to that of the resistance element R2. In addition, it is desirable that the CMOS inverter circuit INV1a should have the same circuit configuration and size as those the CMOS inverter circuit INV1 has, that the CMOS inverter circuits INV1a and INV1 should use the common power supply, and that the CMOS inverter circuits INV1a and INV1 should be positioned as close to each other as possible inside the semiconductor integrated circuit device 1a.

In the semiconductor integrated circuit device 1a with the foregoing configuration, the operational amplifier OP is configured so as to output an output signal depending on the electric potential difference between the output signal from the bandpass filter circuit 20 and the output signal from the differential compensation circuit 21. Such a configuration causes signals inputted in the two input terminals of the operational amplifier to oscillate between the same phases, and accordingly, to cancel each other, in a case where noise is superimposed on the power supply, the GND terminal and the like of the semiconductor integrated circuit device 1a. This turns the signal to be outputted from the operational amplifier OP into a signal less influenced by the noise. As a result, noise components included in the reference signal to be inputted into the PLL circuit 30 are reduced by the bandpass filter circuit 20, and noise components in the power supply and the GND terminal of the semiconductor integrated circuit device 1a are accordingly reduced. This reduces jitter components in the clock signal outputted by the PLL circuit 30 to a large extent.

SECOND EXAMPLE

Figure 6:
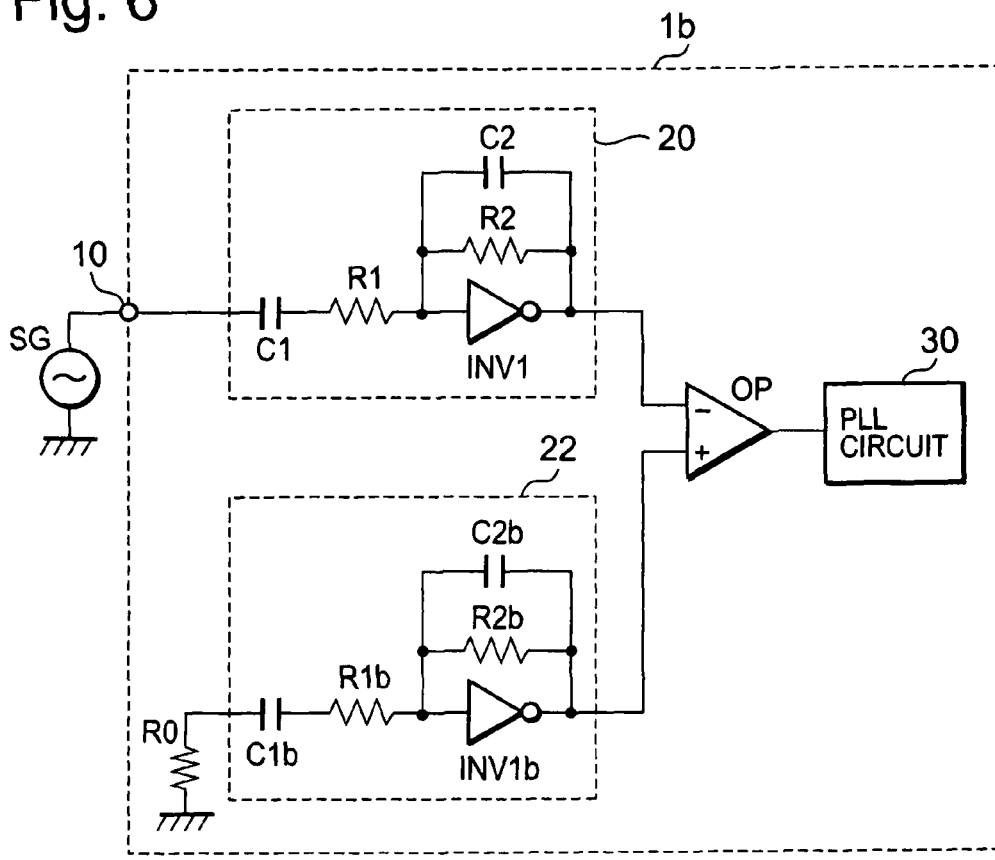
FIG. 6 is a circuit diagram of a semiconductor integrated circuit device according to a second example of the present invention.

FIG. 6 is a circuit diagram of a semiconductor integrated circuit device according to a second example of the present invention. Reference numerals and symbols in FIG. 6 which are the same as those in FIG. 5 denote the same components, and the descriptions for those components will be omitted. A semiconductor integrated circuit device 1b shown in FIG. 6 includes a differential compensation circuit 22 and a terminating resistor R0 in lieu of the differential compensation circuit 21 shown in FIG. 5. The differential compensation circuit 22 has the same configuration as that the bandpass filter circuit 20 has. Specifically, the differential compensation circuit 22 includes a CMOS inverter circuit INV1b, resistance elements R1b and R2b as well as capacitance elements C1b and C2b. The resistance element R1b and the capacitance element C1b are serially connected to each other. One end of the serially-connected circuit is connected to one end of the terminating resistor R0 whereas the other end of the serially-connected circuit is connected to the input terminal of the CMOS inverter circuit INV1b. In addition, the resistance element R2b and the capacitance element C2b are connected to each other in parallel. One end of each of the resistance element R2b and the capacitance element C2b is connected to the input terminal of the CMOS inverter circuit INV1b whereas the other end of each of the resistance element R2b and the capacitance element C2b are connected to the output terminal of the CMOS inverter circuit INV1b. The other end of the terminating resistor R0 is grounded. Here, the terminating resistor R0 is designed to have a resistance value corresponding to the signal source impedance of the reference frequency signal SG. Furthermore, the resistance elements R1b and R2b are designed to have resistance values respectively equal to those of the resistance elements R1 and R2 whereas the capacitance element C1b and C2b are designed to have capacitance values respectively equal to those of the capacitance elements C1 and C2.

In the semiconductor integrated circuit device 1b with the foregoing configuration, the operational amplifier OP is configured so as to output an output signal depending on the electric potential difference between an output signal from the bandpass filter circuit 20 and an output signal from the differential compensation circuit 22. Such a configuration causes signals inputted in the two input terminals of the operational amplifier to oscillate between the same phases, and accordingly, to cancel each other, in a case where noise is superimposed on the power supply, the GND terminal and the like of the semiconductor integrated circuit device 1b, as in the case of the first example. This turns the signal to be outputted from the operational amplifier OP into a signal less influenced by the noise. In this case, the common mode rejection effect of the operational amplifier OP is further enhanced even for high-frequency components, because the differential compensation circuit 22 and the bandpass filter circuit 20 have the same configuration. It should be noted that the terminating resistor R0 may be arranged on the exterior of the semiconductor integrated circuit device 1b while providing the semiconductor integrated circuit device 1b with a connecting terminal for the terminating resistor R0. This arrangement makes it possible to further enhance the effect of reducing common-phase noises by laying out the wirings from the semiconductor integrated circuit device 1b to the terminating resistor R0 and the signal source of the reference frequency signal SG.

It is apparent that the present invention is not limited to the above embodiments, but may be modified and changed without departing from the scope and spirit of the invention.

What is claimed is:

1. A bandpass filter circuit comprising:

a serially-connected circuit comprising a first capacitance element and a first resistance element, a first end of the serially-connected circuit being coupled to an input terminal, and a second end thereof being coupled to an input terminal of a CMOS inverter circuit; and a parallel-connected circuit comprising a second capacitance element and a second resistance element, a first end of the parallel-connected circuit being coupled to the input terminal of the CMOS inverter circuit, and a second end thereof being coupled to an output terminal of the CMOS inverter circuit.

2. The bandpass filter circuit according to claim 1, further comprising an amplifier comprising the CMOS inverter circuit, wherein the CMOS inverter circuit comprises a first CMOS inverter circuit and the bandpass filter circuit further comprises:

a differential compensation circuit including a second CMOS inverter circuit for differential compensation, and a third resistance element having a resistance value equal to that of the second resistance element, a first end of the third resistance element being coupled to an input terminal of the second CMOS inverter circuit, and a second end of the third resistance element being coupled to an output terminal of the second CMOS inverter circuit; and an operational amplifier, whose first differential input terminal is coupled to an output terminal of the bandpass filter circuit, whose second differential input terminal is coupled to an output terminal of a differential input terminal of the differential compensation circuit.

* * * * *